United States Patent
Kline et al.

(10) Patent No.: US 6,445,583 B1
(45) Date of Patent: Sep. 3, 2002

(54) SNAP IN HEAT SINK SHIELDING LID

(75) Inventors: James E. Kline, Blairstown, NJ (US); Michael J. Oliver, Delaware Water Gap, PA (US)

(73) Assignee: Laird Technologies, Inc., Delaware Water Gap, PA (US)

( * ) Notice: Subject to any disclaimer, the term of this patent is extended or adjusted under 35 U.S.C. 154(b) by 56 days.

(21) Appl. No.: 09/771,038

(22) Filed: Jan. 26, 2001

(51) Int. Cl.[7] .................................................. H05K 7/20
(52) U.S. Cl. ...................... 361/704; 361/800; 361/816; 361/818; 165/80.3; 257/718; 257/719; 174/35 R
(58) Field of Search ................... 361/690, 688, 361/704, 707–711, 714–722, 769, 783, 800, 816, 818, 752, 753, 796, 799; 165/80.2, 80.3, 80.4, 185; 174/16.3, 35 R, 35 GC, 50, 51; 257/706–727; 206/719; 439/92, 95, 108, 607, 487

(56) References Cited

U.S. PATENT DOCUMENTS

| | | | |
|---|---|---|---|
| 3,208,511 A | | 9/1965 | McAdam |
| 3,572,428 A | | 3/1971 | Monaco |
| 4,203,488 A | | 5/1980 | Johnson |
| 4,481,525 A | | 11/1984 | Calabro |
| 4,754,101 A | * | 6/1988 | Stickney et al. .......... 174/35 R |
| 5,175,395 A | * | 12/1992 | Moore ....................... 174/35 R |
| 5,241,453 A | * | 8/1993 | Bright et al. ................ 361/704 |
| 5,285,350 A | | 2/1994 | Villaume |
| 5,295,043 A | | 3/1994 | Beijer |
| 5,354,951 A | * | 10/1994 | Lange et al. ............... 174/35 R |
| 5,367,433 A | * | 11/1994 | Blomquist ................... 361/704 |
| 5,416,668 A | * | 5/1995 | Benzoni ...................... 361/816 |
| 5,485,037 A | | 1/1996 | Marrs |
| 5,541,811 A | * | 7/1996 | Henningsson et al. ....... 361/704 |
| 5,566,052 A | * | 10/1996 | Hudhes ....................... 361/704 |
| 5,717,248 A | * | 2/1998 | Neumann et al. ........... 257/718 |
| 5,804,875 A | | 9/1998 | Remsburg et al. |
| 5,866,943 A | | 2/1999 | Mertol |
| 5,893,409 A | | 4/1999 | Kohler |
| 6,166,918 A | * | 12/2000 | Oloffson et al. ............ 361/800 |
| 6,178,097 B1 | * | 1/2001 | Hauk .......................... 361/816 |
| 6,181,573 B1 | * | 1/2001 | Riet ............................ 361/816 |

* cited by examiner

*Primary Examiner*—Darren Schuberg
*Assistant Examiner*—Michael Datskovsky
(74) *Attorney, Agent, or Firm*—Pitney, Hardin, Kipp & Szuch LLP

(57) ABSTRACT

A construction and method are provided for electronically shielding an electronic component and for removing heat generated by the component. The construction and method involve the use of a shielding can, formed with EMI shielding material that surrounds the electronic component and a lid or cap that both contacts and forms a heat sink with the component and also provides a shielding effect as it acts as the cap for the shielding can.

20 Claims, 4 Drawing Sheets

SNAP IN HEAT SINK SHIELDING LID

BACKGROUND OF THE INVENTION

The invention relates generally to shielding devices and more particularly to lids for shielding cans used to shield electronic components from electromagnetic interference (EMI).

Many electronic apparatuses, such as computer products, cellular phones and the like, include electronic components, such as printed circuit boards (PCBs) and integrated circuits (ICs). It is often desirable to isolate the electronic component) to prevent the EMI from the component from affecting other electronic components incorporated in the apparatus or for shielding the component from EMI emitted by other sources.

Many electronic components generate significant amounts of heat. Excessive heat build up can lead to reduced product life and reliability. Thus, various constructions have been proposed for removing heat generated by electronic components.

Existing constructions and methods for simultaneously removing heat from an electronic component and for shielding the component have not always proven to be fully satisfactory, such as in view of the complexity, size, costs or effectiveness of these constructions and methods. Accordingly, it is desirable to provide an improved construction and method for shielding an electronic component and removing heat from the component, which overcomes inadequacies of the prior art.

SUMMARY OF THE INVENTION

Generally speaking, in accordance with the invention, an improved construction and method are provided for electronically shielding an electronic component and for removing heat generated by the component. The construction and method involves the use of a shielding can, formed with EMI shielding material that surrounds the electronic component and a lid or cap that both contacts and forms a heat sink with the component and also provides a shielding effect as it acts as the cap for the shielding can.

The can may be formed with side walls and an opening, such as a window located at the top thereof. The lid can be in the form of a resilient member formed of electrical and heat conductive material and preferably having heat dispersing fins, which snaps in place at the opening in the can, and maintains good contact with the electronic component. In preferred embodiments of the invention, the lid is spring biased against the component. The shielding lid can be formed as a snap in lid that includes a contacting surface to draw heat from the heat producing component and outwardly extending fins which transfer heat drawn from the component to the surrounding environment.

The shielding can may be any known electrical housing with any number of sidewalls and with a single or stepped horizontal top surface having one or more openings, each providing shoulder for the snap-in lid. The can may include a window at the top surface thereof and side walls that extend up and then can extend partially into the interior of the can, to provide a shoulder defining the opening. The lid can include a camming surface which snaps under the shoulder and biases the lid down onto the heat producing component, so as to maintain good thermal contact between the lid and the component. In certain embodiments of the invention, heat conductive material, such as electronically insulating heat conductive material, in the form of gels, coatings, paints, rubbers, elastomers, polymers and resins can be disposed at the interface of the lid and the electronic component.

Accordingly, it is an object of the invention to provide improved structures for shielding an electronic component and for drawing heat from the component;

Another object of the invention is to provide improved methods for shielding an electronic component and for drawing heat from the component.

The invention accordingly comprises the several steps and the relation of one or more of such steps with respect to each of the others, and the article possessing the features, properties and the relation of elements which are exemplified in the following detailed disclosure. The scope of the invention will be indicated in the claims.

BRIEF DESCRIPTION OF THE DRAWINGS

For a better understanding of the invention, reference is had to the following description, taken in connection with the accompanying drawings, in which.

DETAILED DESCRIPTION OF THE PREFERRED EMBODIMENTS

Figure 1:
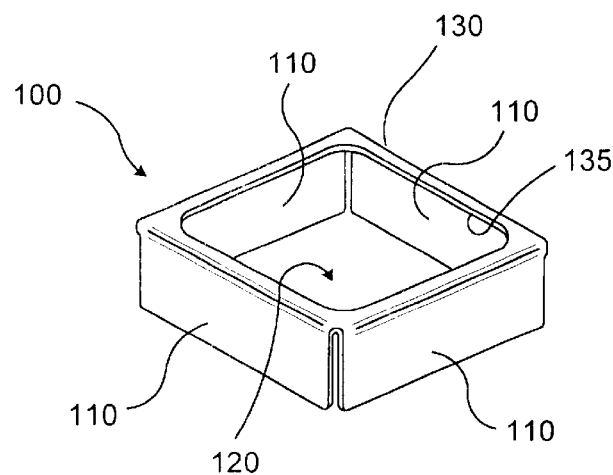
FIG. 1 is a perspective view of a shielding can for use in accordance with preferred embodiments of the invention.
Figure 2:
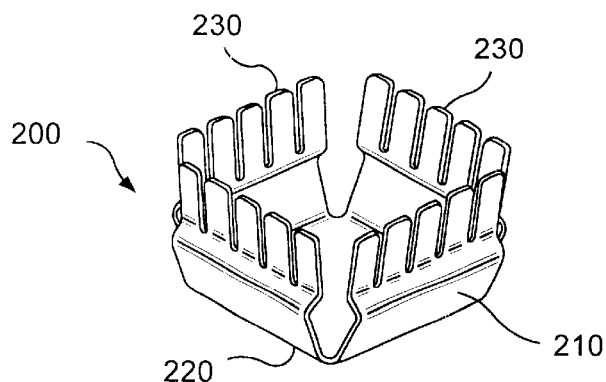
FIG. 2 is a perspective view of a shielding/heat sink lid, constructed in accordance with preferred embodiments of the invention.
Figure 3:
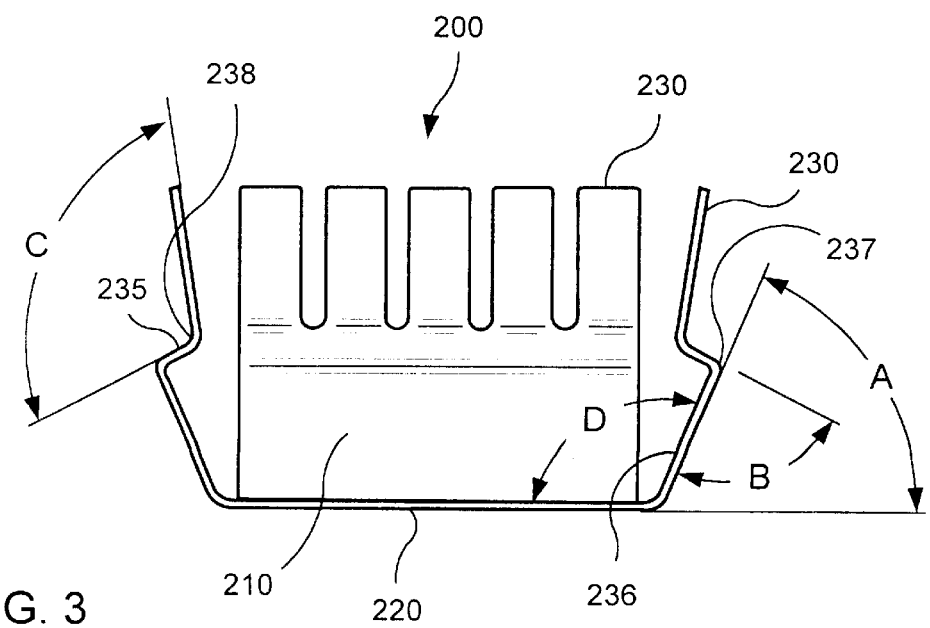
FIG. 3 is a side view of the lid of FIG. 2.

A non-limiting example of a shielding can for use in constructions and methods in accordance with preferred embodiments of the invention is shown generally as shielding can 100 in FIG. 1. Shielding can 100 is of a generally known type and should be formed of EMI shielding material, such as various conductive materials, including brass, copper, aluminum, copper beryllium alloy, phosphor bronze or steel. Shielding can 100 can be formed from a flat sheet of metal having four tabs 110 which are folded down to become the four side walls of can 100. Shielding can 100 also includes an open window 120 defined by an inner edge 135 of an upper shoulder 130. As would be apparent to those of ordinary skill in the art, other configurations of a shielding can may be used, as appropriate.

In use, shielding can 100 is disposed over an electronic component, for the purpose of shielding the component from EMI emitted from other electronic components or to prevent EMI from the device shielded by the can from interfering with other components. Components which are commonly shielded include ICs, PBCs and the like which can be mounted on a PC board and the shielding can 100 is likewise mounted on the PC board. In preferred embodiments of the invention, shielding can 100 can be grounded in any number of ways, which would be apparent to those of ordinary skill in the art.

A non-limiting example of a heat sink shielding lid for use in constructions and methods in accordance with the invention is shown generally as shielding lid 200 in FIGS. 2–5. Shielding lid 200 is preferably formed from a heat conductive and EMI shielding material. Shielding lid 200 is also advantageously formed of a resilient spring-like material. Advantageous materials includes beryllium copper alloys, such as alloy c 17410, aluminum, brass and phosphor bronze. Lid 200 can be bare metal or coated with a suitable electrically conductive plating to provide galvanic compatibility with shielding can 100

Shielding lid 200 is advantageously formed from a flat sheet of metal having four tabs, which are bent up to form four spring walls 210 of shielding lid 200. Spring walls 210 extend upwards from a heat sink wall 220, the bottom surface of which is intended to contact the heat producing component. In certain preferred embodiments of the invention, at least heat sink wall contact surface 220 is covered with an electrically insulating material and/or a heat conductive material to prevent current from flowing from the component into lid 200 and to enhance the conduction of heat from the component into lid 200. Preferred materials include ceramic particles, ferrite EMI/RFI absorber particles or metal or fiber glass mesh in a base of rubber, gel, grease or wax.

In one preferred embodiment of the invention, shielding can 100 is formed from a 0.015" thick sheet of brass which can be tin plated. The outside dimensions of each wall 110 are 1.5" and the inside diameter of window 120 is 1.280". Walls 110 are 0.5" high. However, as would be apparent to those of ordinary skill in the art, these dimensions can be varied and modified, based on the size of the component to be shielded, space considerations within the overall apparatus and other factors of design choice.

Shielding lid 200 can be formed from a 0.01" thick beryllium copper alloy. Each spring wall 210 and the sides of contact surface 220 can be slightly under 1" in width. Each side wall 210 can have a height of 0.904" and each tab 230 can have a height of 0.36" and a width of 0.151". The gap between fins 230 can be 0.06".

Each spring wall 210 includes an insertion wall 236, at an outside angle A to bottom surface 220. Angle A should be less than 90°, generally from about 45–85°, preferably 60 to 70° and most preferably about 65°. Insertion wall 236 slides against edge 135, which deflects spring walls 210 inwards, temporarily increasing angle A.

Spring wall 210 also includes a camming shoulder 235 at an angle B to insertion wall 236, extending from an outside corner 237 to an inside corner 238. Angle B can be about 80 to 100°, preferably about 90°. Because shoulder 235 will be at an acute angle to the underside of edge 135 and spring wall 210 is biased outwards, the interaction between shoulder 235 and edge 135 causes can 100 to exert a downwards force on lid 200, which serves to improve the contact heat transfer between bottom surface 220 and the component being shielded and cooled.

Spring wall 210 also includes an upper portion, above inner corner 238, which is advantageously formed with fins 230, advantageously at an angle C to camming shoulder 235. Angle C is advantageously less than 115 degrees and may be varied greatly to fit the fins 230 within the space where the component 500 is located. The height of fins 230 will be affected by space and heat transfer considerations.

Figure 4A:
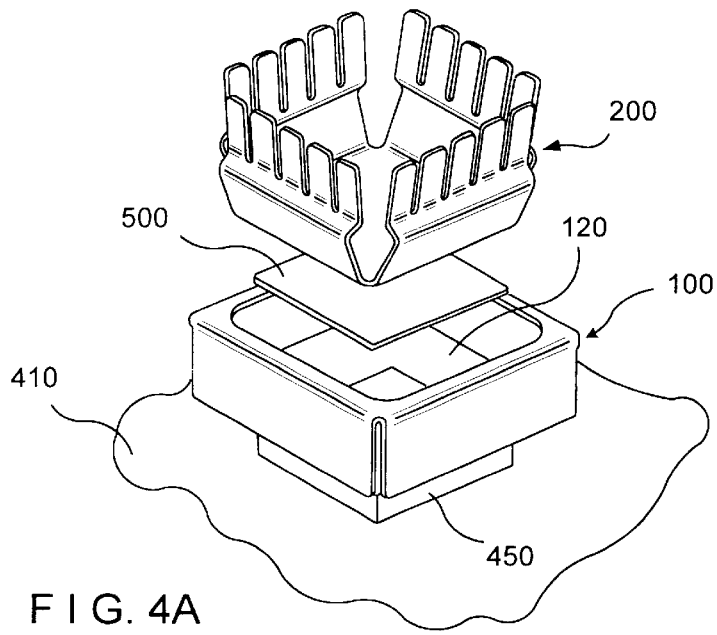
FIG. 4A is a perspective view of the can of FIG. 1 and the lid of FIG. 2, prior to installation.
Figure 4B:
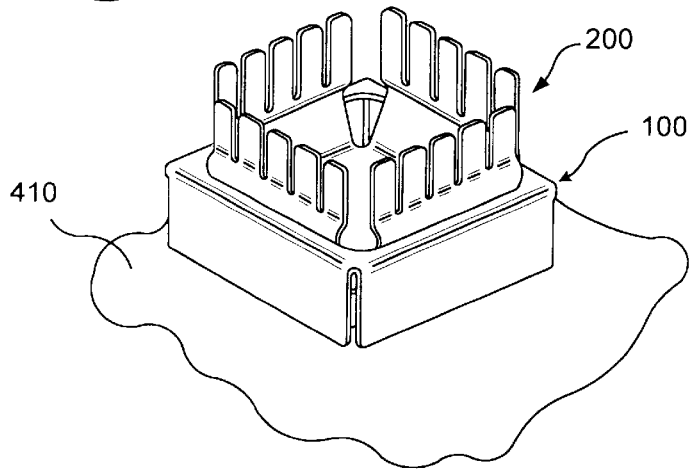
FIG. 4B is a perspective view shows the can and lid of FIG. 4A, during installation.
Figure 4C:
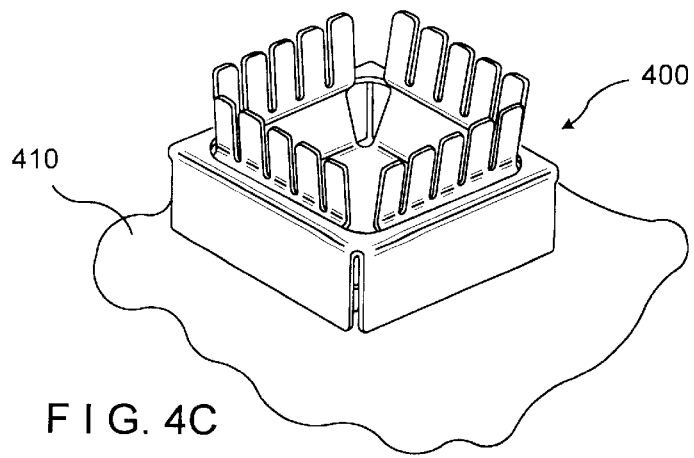
FIG. 4C is a perspective view showing the lid of FIG. 4A installed in the can of FIG. 4B.
Figure 5:
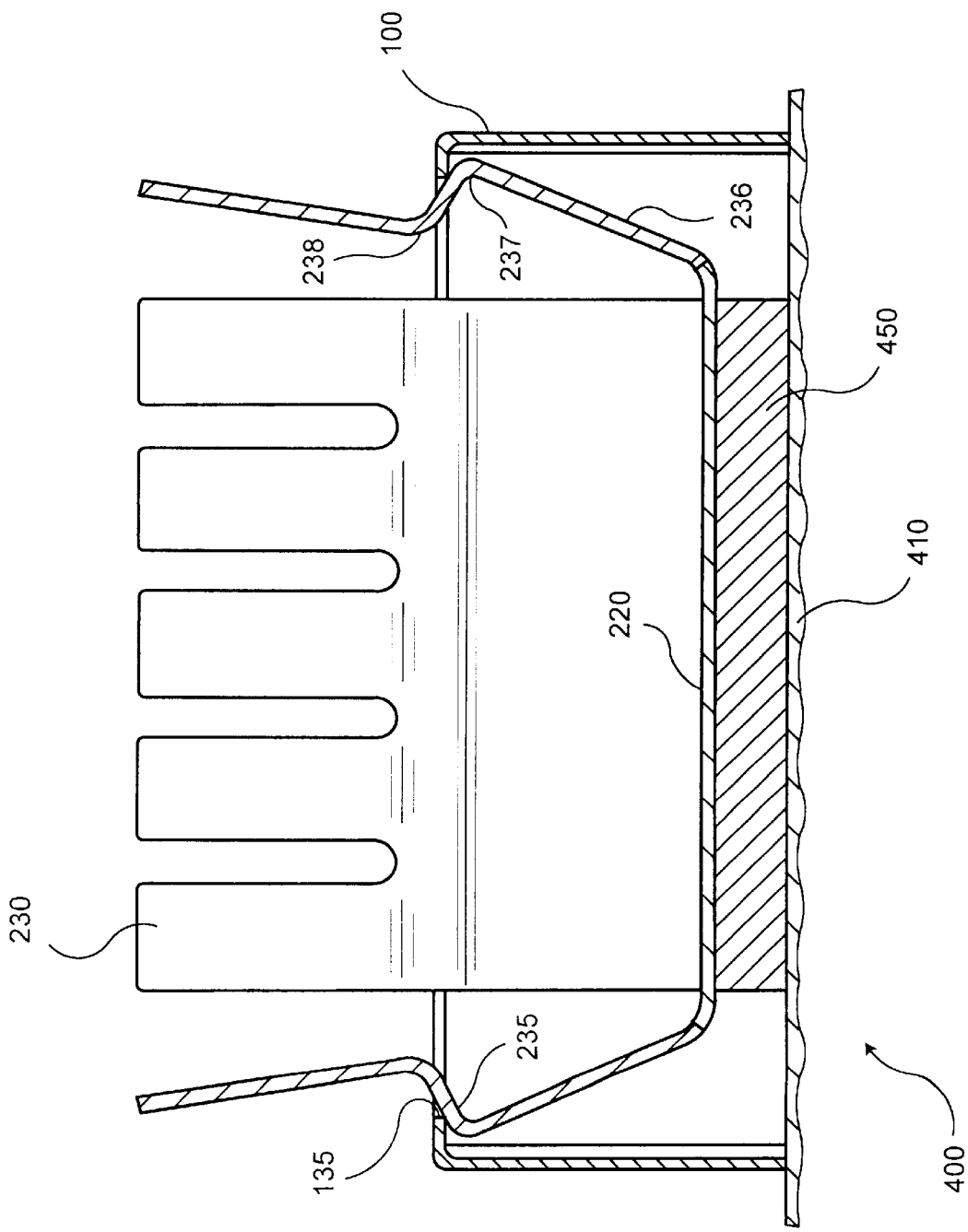
FIG. 5 is a side cross-sectional view of the installed lid and can of FIG. 4C.

Referring to FIG. 4A, shielding can 100 is shown mounted on a PC board 410 over an electronic component 450. As shown in FIG. 4B, as shielding lid 200 is pressed into window 120 of can 100, insertion surfaces 235 impinge on edge 135 and bend spring walls 236 inwardly. As edge 135 clears corner 237 where shoulder 235 meets wall 236, the springiness of spring wall 210 and the angle of contact with shoulder 235 force lid 200 down onto the top of the electronic device 450, to yield a snap-in heat sink shielding construction 400 of FIG. 4C. Accordingly, it is advantageous that in final construction 400, when lid 200 is in its final position, that edge 135 rests between corners 237 and 238, advantageously approximately midway between corners 237 and 238. Reaction force cause by internal stress on lid 200 acts to hold lid 200 down firmly against electronic component 450, so as to make good thermal contact. In certain preferred embodiments of the invention, a conductive interface material 500 is disposed between lid 200 and component 450 as either a separate layer, on the top surface of component 450 or on the bottom surface 220 of lid 200. Such materials can include ceramic particles, ferrite EMI/RFI absorber particles, or metal or fiberglass mesh in a base of rubber, gel, grease or wax.

As evident of the foregoing, the invention provides a heat sink, advantageously formed of thermally conductive and electronically shielding springy material, but preferably copper beryllium alloy, that makes acceptable thermal contact with a heat producing component, such as an integrated circuit, either directly or through an appropriate layer of thermally conductive interface material, such as thermally conductive elastomer or gel or ferrite loaded elastomer, while electronically shielding the heat producing component. The invention can provide a simple-to-construct single piece snap-in lid that includes a contact surface area to draw heat from the heat producing device and fins to transfer such heat to the surrounding environment. By making the lid of a springy material, it can snap into an aperture, such as a window on the top of an existing shielding can, and thereby electrically shielding the device and provide force between the lid and the device to enhance thermal contact.

Figure 6:
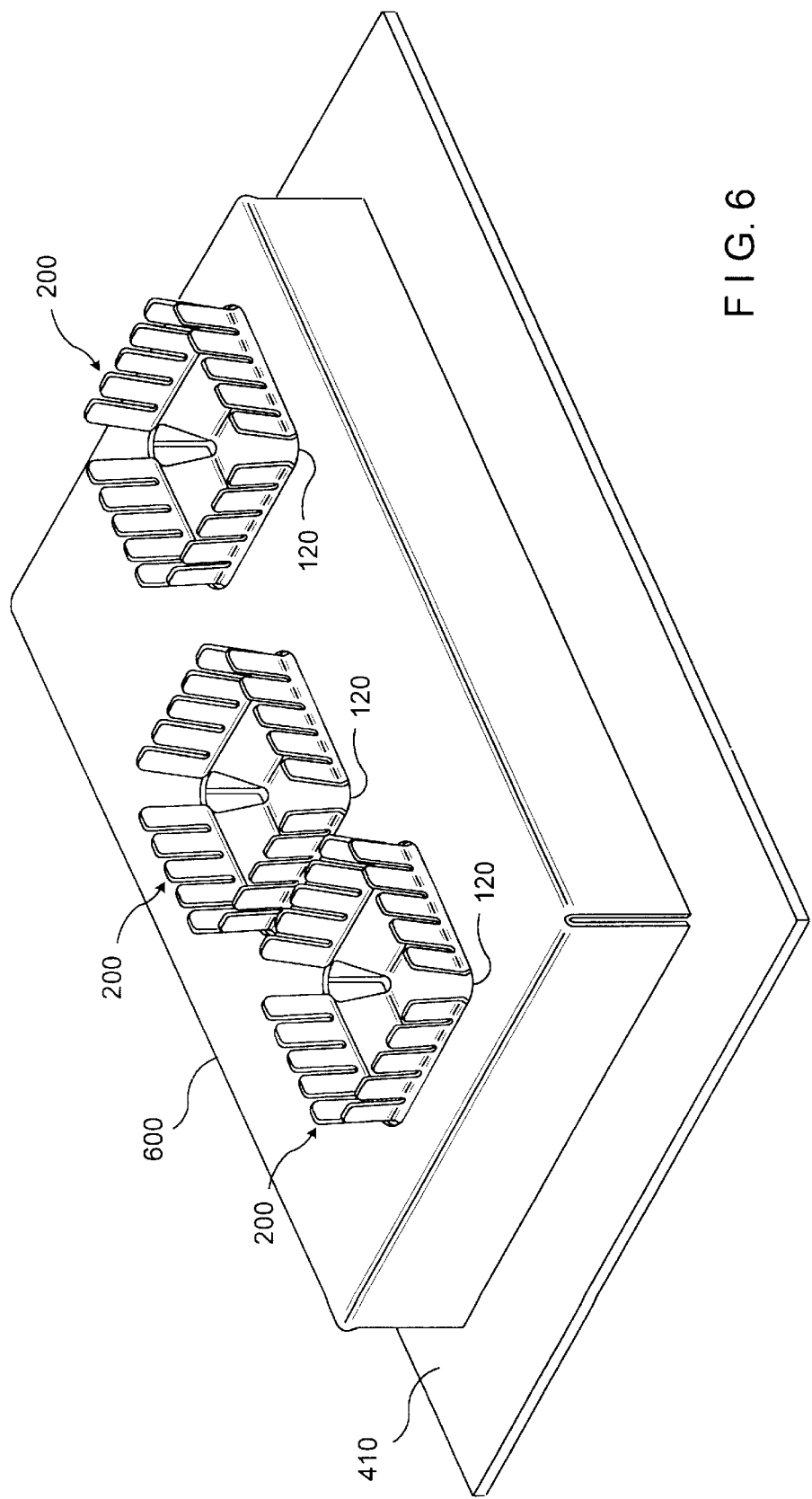
FIG. 6 is a perspective view of a shielding can having multiple snap-in heat sink lids.

Lids in accordance with the invention can also be used in shielding cans having multiple apertures which house multiple heat producing components. Referring to FIG. 6, a shielding can 600 is shown mounted on PC board 410 over electronic components not shown. Shielding can 600 is formed with three windows 120 into each of which a shielding lid 200 is inserted.

It will thus be seen that the objects set forth above, among those made apparent from the preceding description, are efficiently attained and, since certain changes are made in carrying out the above method and in the articles set forth, without departing from the spirit and scope of the invention, it is intended that all matter contained in the above description and shown in the accompanying drawings, shall be interpreted as illustrative and not in a limiting sense.

It should also be understood that the following claims are intended to cover all of the generic and specific features of the invention herein described and all statements of the scope of the invention which, as a matter of language, might be said to fall there between.

What is claimed is:

1. A lid structure for electrically shielding an electrical component, comprising:
   a lid comprising electrically shielding and heat conductive material and having resilient properties;
   the lid including a lower contact wall configured to be put in contact with the electrical component and a wall structure extending upwards from the lower contact wall and defining an upper inner region bounded in part by the wall structure;

at least one portion of the wall structure having a physical feature extending outwards to contact an edge defining an opening of a shielding can as the lid is inserted into the opening of the can and thereby spring bias the portion of the wall structure towards the upper inner region;

the wall structure also including a camming structure for contacting the can and biasing the lid down onto the electrical component when the lid is installed in the can; and a heat dissipation surface extending from the camming structure.

2. The lid structure of claim 1, wherein the wall structure comprises four upwardly extending walls, at least one of which can be spring biased inwardly and outwardly.

3. The lid structure of claim 2, wherein each of the walls are separated from each other and each are joined to the lower contact surface.

4. The lid structure of claim 2, wherein each of the four walls includes the outwardly extending feature and the camming structure.

5. The lid structure of claim 2, wherein at least one of the walls extends upwards at an obtuse angle from the contact wall and then, at a corner, bends and extends inwards to be at an acute angle to the contact wall, and at least a portion of the wall extending inwards comprises the camming structure.

6. The lid structure of claim 2, wherein at least one wall extends upwards and outwards at an angle of about 95° to 135° from the lower contact wall.

7. The lid structure of claim 5, wherein the angle at the corner between the outwardly and inwardly extending portions is about 80° to 100°.

8. The lid structure of claim 1, wherein the heat dissipating surface comprises a plurality of fins.

9. The lid structure of claim 1, wherein the lower outside surface of the contact wall comprises at least a layer of a thermally conductive conformable pad.

10. The lid structure of claim 1, and comprising a shielding can having a housing structure extending upwards and having an engagement edge, the engagement edge in contact with the camming structure at an angle such that the resilient properties of the wall causes a downward force on the lid.

11. The lid structure of claim 10, wherein the can includes four walls defining an interior, an electrical component is within the interior, and the engagement edge comprises and an inwardly projecting ridge at the top of the walls of the can.

12. The lid structure of claim 11, wherein the electrical component is an integrated circuit.

13. The lid structure of claim 10, wherein the housing structure comprises brass, phosphor bronze or steel.

14. The lid structure of claim 1, comprising an electrical component against the contact surface and compliant heat conductive material is interposed between the contact surface and the component.

15. The lid structure of claim 1, wherein the lid comprises copper beryllium alloy, copper, aluminum, brass or phosphor bronze.

16. A method of shielding and drawing heat from an electrical component, comprising:

locating an electrical component within a shielding can formed of electrically shielding material, having an opening defined therein;

disposing a lid formed of EMI shielding and heat conductive material into the opening, against the electrical component and in engagement with the can in such a manner that reactive force between the can and the lid urge the lid against the component.

17. The method of claim 16, wherein heat conductive material is disposed between the component and the lid.

18. The method of claim 16, wherein the lid includes fins.

19. In combination a shielding can and at least one lid structure for electrically shielding an electrical component comprising:

a lid comprising electrically shielding and heat conductive material and having resilient properties;

the lid including a lower contact wall configured to be put in contact with the electrical component and a wall structure extending upwards from the lower contact wall and defining an upper inner region bounded in part by the wall structure;

at least one portion of the wall structure having a physical feature extending outwards to contact an edge defining an opening of a shielding can as the lid is inserted into the opening of the can and thereby spring bias the portion of the wall structure towards the upper inner region;

the wall structure also including a camming structure for contacting the can and biasing the lid down onto the electrical component when the lid is installed in the can; and a heat dissipation surface extending from the camming structure.

20. The invention in accordance with claim 19 wherein said shielding can has a plurality of openings and further comprising an equal plurality of lid structures.

* * * * *